US010859658B2

(12) United States Patent
Edelman et al.

(10) Patent No.: US 10,859,658 B2
(45) Date of Patent: Dec. 8, 2020

(54) SYSTEM AND METHOD FOR SEMI-PROJECTIVE QUANTITATIVE FLOW IMAGING USING ACCELERATED ARTERIAL SPIN-LABELED CINE MRI

(71) Applicant: NORTHSHORE UNIVERSITY HEALTHSYSTEM, Evanston, IL (US)

(72) Inventors: Robert R. Edelman, Highland Park, IL (US); Ioannis Koktzoglou, Des Plaines, IL (US)

(73) Assignee: NORTHSHORE UNIVERSITY HEALTHSYSTEM, Evanston, IL (US)

( * ) Notice: Subject to any disclaimer, the term of this patent is extended or adjusted under 35 U.S.C. 154(b) by 40 days.

(21) Appl. No.: 16/395,835

(22) Filed: Apr. 26, 2019

(65) Prior Publication Data
US 2019/0369196 A1    Dec. 5, 2019

Related U.S. Application Data

(60) Provisional application No. 62/677,742, filed on May 30, 2018, provisional application No. 62/725,374, filed on Aug. 31, 2018.

(51) Int. Cl.
*G01R 33/563*    (2006.01)
*G01R 33/565*    (2006.01)
(Continued)

(52) U.S. Cl.
CPC ..... *G01R 33/5635* (2013.01); *G01R 33/4824* (2013.01); *G01R 33/5608* (2013.01); *G01R 33/5613* (2013.01); *G01R 33/56509* (2013.01)

(58) Field of Classification Search
USPC ......................................................... 324/309
See application file for complete search history.

(56) References Cited

U.S. PATENT DOCUMENTS 7,253,620 B1    8/2007  Derbyshire et al.
8,332,010 B2   12/2012  Edelman
(Continued)

OTHER PUBLICATIONS

Derbyshire et al., S5FP: Spectrally Selective Suppression with Steady State Free Precession, Magnetic Resonance in Medicine, 2005, 54(4):918-928.
(Continued)

*Primary Examiner* — Rodney E Fuller
(74) *Attorney, Agent, or Firm* — Quarles & Brady LLP

(57) ABSTRACT

A system and method for controlling a magnetic resonance imaging (MRI) system to create magnetic resonance (MR) cine angiograms of a subject. The method includes controlling the MRI system to acquire MR data from the subject by performing at least one cine acquisition pulse sequence having a plurality of acquisition RF pulse modules applied at constant intervals throughout a cardiac cycle, and at least one labeling pulse sequence including a first and a second α/2 module and a labeling RF pulse module for labeling a region of inflowing arterial flow through a vessel of interest. The method further includes reconstructing the MR data to form a series of cine frames that form a cine angiogram, subtracting at least one cine frame from other cine frames reconstructed from the MR data, and displaying the MR cine angiogram of the vessel of interest.

39 Claims, 6 Drawing Sheets

(51) Int. Cl.
*G01R 33/561* (2006.01)
*G01R 33/48* (2006.01)
*G01R 33/56* (2006.01)

(56) References Cited

U.S. PATENT DOCUMENTS

| | | | |
|---|---|---|---|
| 9,211,081 B2 | 12/2015 | Edelman | |
| 9,526,423 B2 | 12/2016 | Edelman | |
| 2015/0327783 A1* | 11/2015 | Wang | G01R 33/4818 600/419 |
| 2019/0113587 A1* | 4/2019 | Paulson | G01R 33/4835 |

OTHER PUBLICATIONS

Dixon et al., Projection Angiograms of Blood Labeled by Adiabatic Fast Passage, Magnetic Resonance in Medicine, 1986, 3(3):454-462.

Edelman et al., Cardiovascular Cine Imaging and Flow Evaluation Using Fast Interrupted Steady-State (FISS) Magnetic Resonance, Journal of Cardiovascular Magnetic Resonance, 2018, 20(1):12, 9 pages.

Edelman et al., Signal Targeting with Alternating Radiofrequency (STAR) Sequences: Application to MR Angiography, Magnetic Resonance in Medicine, 1994, 31(2):233-238.

Iryo et al., Collateral Circulation Via the Circle of Willis in Patients with Carotid Artery Steno-Occlusive Disease: Evaluation on 3-T 4D MRA Using Arterial Spin Labelling, Clinical Radiology, 2015, 70(9):960-965.

Koktzoglou et al., Radial Fast Interrupted Steady-State (FISS) Magnetic Resonance Imaging, Magnetic Resonance in Medicine, 2018, 79(4):2077-2086.

Marckmann et al., Nephrogenic Systemic Fibrosis: Suspected Causative Role of Gadodiamide Used for Contrast-Enhanced Magnetic Resonance Imaging, Journal of the American Society of Nephrology, 2006, 17(9):2359-2362.

Okell et al., Optimization of 4D Vessel-Selective Arterial Spin Labeling Angiography Using Balanced Steady-State Free Precession and Vessel-Encoding, NMR in Biomedicine, 2016, 29(6):776-786.

Scheffler et al., Magnetization Preparation During the Steady State: Fat-Saturated 3D TrueFISP, Magnetic Resonance in Medicine, 2001, 45(6):1075-1080.

Wu et al., Noncontrast Dynamic 3D Intracranial MR Angiography Using Pseudo-Continuous Arterial Spin Labeling (PCASL) and Accelerated 3D Radial Acquisition, Journal of Magnetic Resonance Imaging, 2014, 39(5):1320-1326.

Xu et al., Noncontrast-Enhanced Four-Dimensional MR Angiography for the Evaluation of Cerebral Arteriovenous Malformation: A Preliminary Trial, Journal of Magnetic Resonance Imaging, 2011, 34(5):1199-1205.

\* cited by examiner

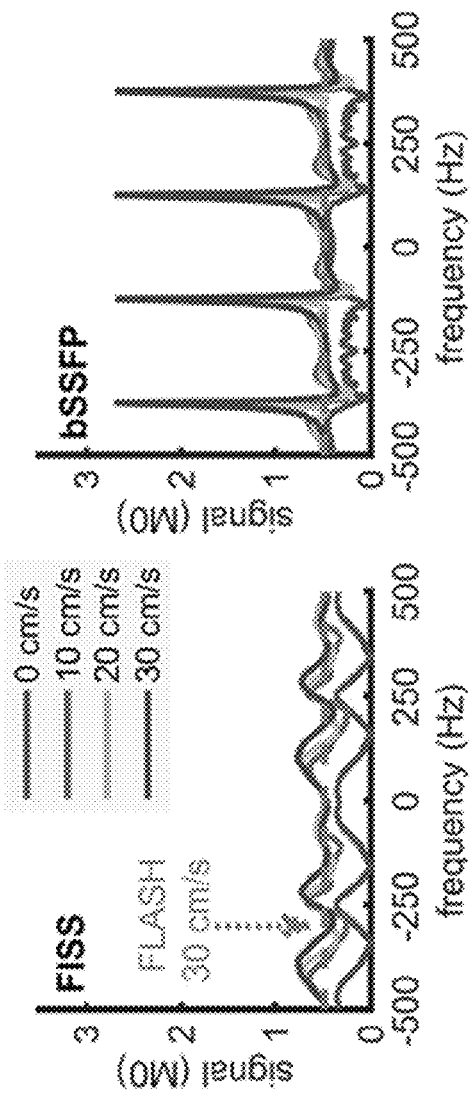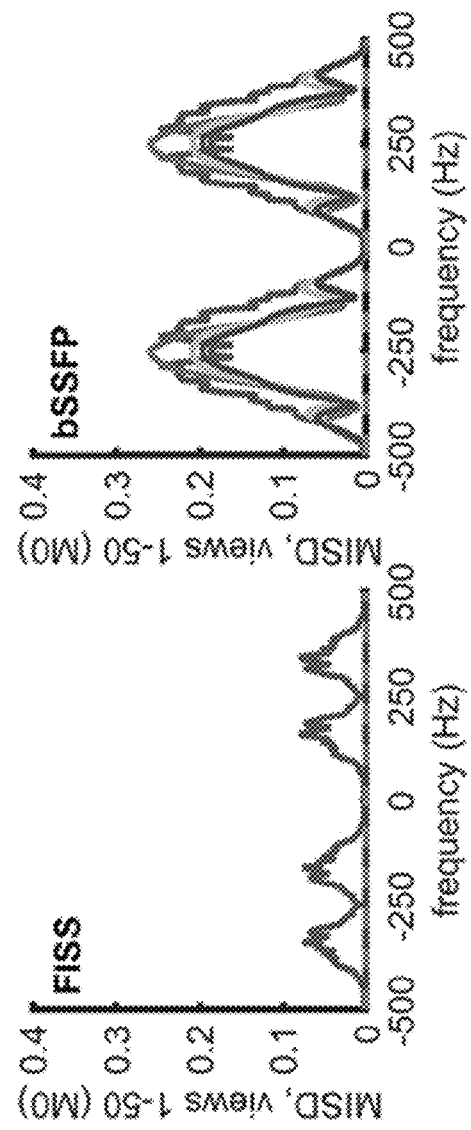

SYSTEM AND METHOD FOR SEMI-PROJECTIVE QUANTITATIVE FLOW IMAGING USING ACCELERATED ARTERIAL SPIN-LABELED CINE MRI

CROSS-REFERENCE TO RELATED APPLICATIONS

This application is based on, claims priority to, and incorporates herein by reference in its entirety, U.S. Provisional Application Ser. No. 62/677,742, filed May 30, 2018, and U.S. Provisional Application Ser. No. 62/725,374, filed Aug. 31, 2018.

STATEMENT REGARDING FEDERALLY SPONSORED RESEARCH

This invention was made with government support under 1R01HL130093 and R21HL126015 both awarded by the National Institutes of Health. The government has certain rights in the invention.

BACKGROUND

The present disclosure relates to magnetic resonance imaging (MRI) and systems. More particularly, the present disclosure relates to systems and methods for magnetic resonance angiography (MRA) and magnetic resonance (MR) Cine angiography.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

Magnetic resonance angiography (MRA) uses the magnetic resonance phenomenon to produce images of the human vasculature. To enhance the diagnostic capability of MRA, a contrast agent such as gadolinium can be injected into the patient prior to the MRA scan. The goal of this contrast enhanced (CE) MRA method is to acquire the central k-space views at the moment the bolus of contrast agent is flowing through the vasculature of interest in order to benefit from improved contrast. That is, collection of the central lines of k-space during peak arterial enhancement, therefore, is key to the success of a CE-MRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins.

Recently, a rare and serious pathology involving fibrosis of skin, joints, eyes, and internal organs referred to as nephrogenic systemic fibrosis ("NSF") has been correlated to the administration of gadolinium-based contrast agents to patients undergoing contrast-enhanced MRA studies. The link between gadolinium-based contrast agents and NSF is described, for example, by P. Marckmann, et al., in "Nephrogenic Systemic Fibrosis: Suspected Causative Role of Gadodiamide Used for Contrast-Enhanced Magnetic Resonance Imaging," *J. Am. Soc. Nephrol.*, 2006; 17 (9):2359-2362. As a result of the increased incidence of NSF, methods for MRA that do not rely on the administration of a contrast agent to the patient have become an important field of research. However, current methods for non-contrast angiography are limited in their utility.

One of the most commonly used pulse sequences in cardiovascular imaging is balanced steady-state free-precession ("bSSFP"), also called trueFISP. The bSSFP pulse sequence is a highly efficient imaging technique that can be used to produce high signal from flowing blood, as well as from fluid-containing structures and fat. It is routinely used for cine and delayed enhanced imaging of the heart.

Despite its clinical utility, the bSSFP pulse sequence has a major drawback for cardiovascular imaging due to sensitivity to artifacts from blood flow. These flow artifacts are especially severe with rapid systolic blood flow and near arterial stenosis and in regions of B0 inhomogeneity. Out of slice magnetization can also produce flow artifacts with bSSFP, especially in areas of off-resonance.

Other drawbacks of bSSFP include: (1) persistent signal contributions from vascular spins that have flowed out of the slice, resulting in flow artifacts and degrading the quality of MR angiograms; (2) difficulty in achieving effective fat suppression with long echo trains or with a radial k-space trajectory; (3) high power deposition, due to the rapid sequential application of radiofrequency (RF) pulses using a large flip angle; and (4) sensitivity to off-resonance artifacts, caused by static magnetic field inhomogeneity.

Despite its great utility at 1.5 Tesla, the use of the bSSFP pulse sequence at high field is severely curtailed by these drawbacks. For example, off-resonance and flow artifacts are much worse at high field, to the point that the images become of a quality that is not viable for diagnostics.

One alternative is to use a spoiled gradient-echo pulse sequence, also called fast low angle shot (FLASH). The FLASH pulse sequence is much less sensitive to off-resonance and flow artifacts, and power deposition is much less of an issue because relatively small flip angles are used. However, the FLASH pulse sequence has its own drawbacks, which include: (1) inferior SNR when compared to the bSSFP pulse sequence and (2) flow saturation artifacts for vascular spins that move slowly or remain in-plane over extended distances.

Variations of the bSSFP pulse sequence have been developed in which the echo train is intermittently paused and restarted to improve fat suppression. For instance, Scheffler et al., as described in Scheffler K, Heid O, Hennig J. Magnetization preparation during the steady state: fat saturated 3D TrueFISP. Magn Reson Med 2001; 45(6):1075-1080, broke up lengthy bSSFP echo trains with pairs of store/restore alpha/2 RF pulses (at a rate of ≈5-6 Hz) to allow the repeated application of fat saturation RF pulses.

Derbyshire et al., as described in Derbyshire J A, Herzka D A, McVeigh E R. S5FP: spectrally selective suppression with steady state free precession. Magn Reson Med 2005; 54(4):918-928; U.S. Pat. No. 7,253,620, Aug. 7, 2007, describes another variant of interrupted bSSFP called "spectrally selective suppression with SSFP" (S5FP), which uses the bandpass filtering properties of interrupted bSSFP to suppress fat signal. The method acquires a series of Cartesian bSSFP echo trains that are each sandwiched between tailored opening and closing subsequences of RF pulses and gradients, with each series repeating at a rate of ≈10-20 Hz. This work, however, has not gained clinical traction, in part due to the resulting artifacts. In particular, severe ghost artifacts occur in the phase-encoding direction due to mismatched echo intensities that arise from repeated interruptions of the bSSFP echo train. The use of a Cartesian k-space trajectory with S5FP directly contributes to the ghost artifacts, since periodic signal fluctuations that occur during the acquisition of central k-space lines have a disproportionately large impact on image contrast. As a result, with S5FP, a complex process of data scaling is used during the image reconstruction process to reduce the ghost artifacts.

The techniques described by Scheffler et al. and Derbyshire et al. provide efficient fat suppression. However, when applied in the context of angiography, the resulting images further suffer from flow artifacts. As described above, flow artifacts may include, for example, steady-state magnetization from out-of-slice spins as well as strongly oscillating signals from off-resonant spins in the transient-state that occur using a bSSFP readout. With bSSFP, these unwanted sources of MR signal variation carry over from one repetition to the next. Consequently, the echo train lengths of Scheffler et al. and Derbyshire et al. (e.g. 24 or more echoes per train) suffer from substantial flow artifacts that are encountered with bSSFP.

The deficiencies of bSSFP and spoiled gradient-echo pulse sequences are particularly prevalent when utilized for MR cine angiography, which uses multiple MR images acquired during the cardiac cycle to create time-resolved images—viewable as "videos"—of the cardiac structure during the cardiac cycle. The time-resolved images created with cine angiography are pivotal in observing, and making a diagnosis relating to, the cardiac function of a subject. However, due to the limitations of bSSFP pulse sequences and spoiled gradient-echo pulse sequences, small-caliber embedded structures such as the coronary and internal mammary arteries are obscured when these methods are used for cine angiography. In particular, cine bSSFP is prone to artifacts from rapid through-plane flow, which can be attributed to failure of rapidly flowing spins to attain a steady-state in the brief interval they reside within the thin slice and mislocalized signal due to steady-state magnetization persisting after the flowing spins have left the slice.

Flow imaging in the cardiovascular system is currently performed using phase contrast MRI. Although 4D approaches are under active investigation, breath-hold 2D cine phase contrast is the mainstay of clinical practice and allows rapid, through-plane flow quantification in the heart and great vessels. A mechanistically-distinct alternative approach for flow imaging involves the use of ASL, which provides a useful quantitative tool for measuring cerebral blood flow and other perfusion indices without the need for contrast infusion.

ASL is a well-established MRI technique which involves the acquisition of two MRI scans that are subtracted to suppress the signal from static background tissue while highlighting the signal from flowing intra-arterial or intra-capillary spins. In one scan, RF pulses are used to label inflowing arterial spins, while in the other "control" scan the inflowing spins are not labeled. If dynamic flow information is needed, the data can be acquired using a temporally-resolved cine ASL acquisition, although the temporal resolution in prior reports has been substantially inferior to that obtained with cine cardiac imaging. To obtain adequate coverage of the vascular region, a 3D acquisition is used resulting in lengthy scan times (e.g. 5 to 10 minutes). Alternatively, a thin-slice 2D cine ASL acquisition allows for faster scanning, at the expense of a reduced signal-to-noise ratio and incomplete volumetric coverage. Unfortunately, the use of a thin-slice 2D acquisition precludes the complete evaluation of a curved or tortuous blood vessel. Alternatively, a full-thickness projection image can be obtained using a spatially non-selective RF excitation, although this results in a marked loss of vascular detail and makes the image sensitive to motion artifact and off-resonance effects.

ASL techniques are most often used to evaluate brain perfusion or collateral flow patterns in the circle of Willis. In recent years, most research efforts using cine ASL have focused on the brain, e.g. to evaluate collateral flow in the circle of Willis or flow dynamics in arteriovenous malformations.

It would therefore be desirable to provide a method for MRA that is not susceptible to these drawbacks with the pulse sequences that are currently available to clinicians for MRA. It is further desirable to provide a method for MR cine angiography that can provide small-caliber details of embedded cardiac structures.

SUMMARY

The present disclosure provides systems and methods that overcome the aforementioned drawbacks using a pulse sequence that provides excellent signal-to-noise ratio (SNR) and image contrast, while avoiding the above-described drawbacks of bSSFP techniques. The systems and methods of the present disclosure may be referred to as the radial fast interrupted steady-state (FISS) technique and provides high on-resonant signal of bSSFP-based imaging, while reducing flow artifacts and signal fluctuations associated with off-resonant spins and spins that have exited the imaging slice. Furthermore, the FISS technique reduces saturation artifacts that are observed with FLASH imaging. The FISS technique can further be used in connection with MR cine angiography to generate cine angiograms suitable for use in the measurement and analysis of arterial flow.

In accordance with aspects of the present disclosure, a method for controlling a magnetic resonance imaging (MRI) system to create magnetic resonance (MR) cine angiograms of a subject is provided. The method includes monitoring a cardiac cycle of the subject while controlling the MRI system to acquire MR data from the subject by performing at least one cine acquisition pulse sequence. The cine acquisition pulse sequence includes a plurality of acquisition radiofrequency (RF) pulse modules applied at constant intervals throughout the cardiac cycle between a labeling interval to acquire the MR data using a radial sampling of k-space. During the labeling interval, a region of inflowing arterial flow through a vessel of interest in the subject is labeled by performing at least one labeling pulse sequence including a first $\alpha/2$ RF pulse module, a labeling RF pulse module, and a second $\alpha/2$ RF pulse module. In this case, a denotes a RF flip angle of the excitation RF pulse module. The method also includes the step of reconstructing the MR data to form a series of cine frames that form an MR cine angiogram of the subject, subtracting at least one cine frame reconstructed from the MR data from other cine frames reconstructed from the MR data, and then displaying the MR cine angiogram of the vessel of interest.

In accordance with another aspect of the disclosure, a magnetic resonance imaging (MRI) system is provided that includes a magnet system configured to generate a polarizing magnetic field about at least a portion of a subject arranged in the MRI system and a plurality of gradient coils configured to apply a gradient field to the polarizing magnetic field. The system also includes a radio frequency (RF) system configured to apply an excitation field to the subject and acquire MR image data from a ROI and a computer system. The computer system is programmed to control the plurality of gradient coils and the RF system to generate a plurality of differently-weighted images of a subject by performing at least one cine acquisition pulse sequence. The cine acquisition pulse sequence includes applying plurality of acquisition RF pulse modules at constant intervals throughout the cardiac cycle between a labeling interval to acquire the MR data using a radial sampling of k-space and, during the labeling interval, labeling a region of inflowing arterial flow through a vessel of interest in the subject by performing at least one labeling pulse sequence including a first α/2 RF pulse module, a labeling RF pulse module, and a second α/2 RF pulse module. In this case, a denotes a RF flip angle of the excitation RF pulse module. The computer system further performs the steps of reconstructing the MR data to form a series of cine frames that form an MR cine angiogram of the subject, and subtracting at least one cine frame reconstructed from the MR data from other cine frames reconstructed from the MR data. A display coupled to the computer system is controlled by the computer system to display the MR cine angiogram of the vessel of interest.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 3A is a graph showing steady-state transverse magnetization of FISS as a function of off-resonance frequency for arterial blood imaged at 3.0 T using a TR=4 ms at four blood flow velocities.

FIG. 3B is a graph showing steady-state transverse magnetization of bSSFP as a function of off-resonance frequency for arterial blood imaged at 3.0 T using a TR=4 ms at four blood flow velocities.

FIG. 3C is a graph showing MISD views versus frequency for FISS.

FIG. 3D is a graph showing MISD views versus frequency for bSSFP.

DETAILED DESCRIPTION

Figure 1:
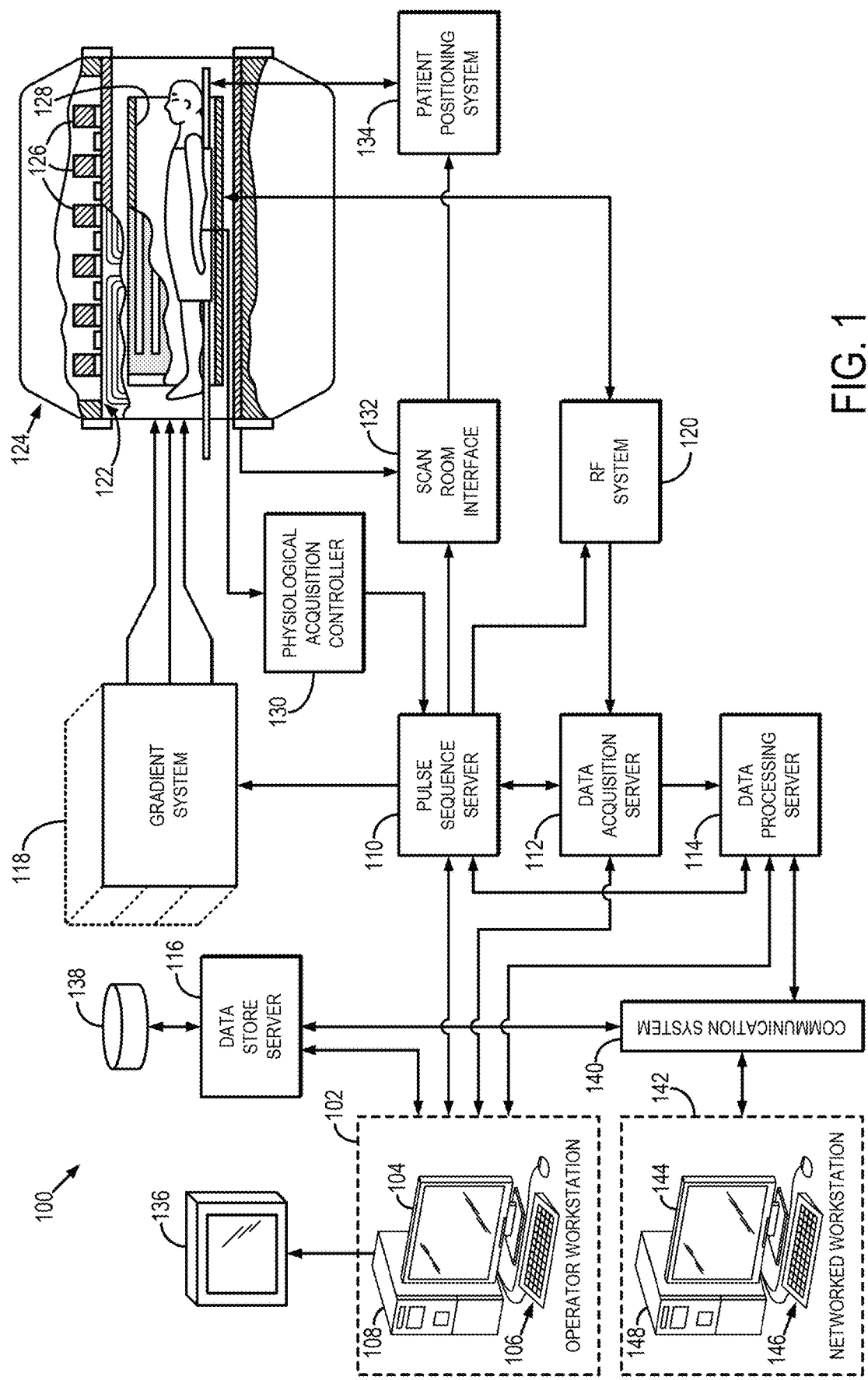
FIG. 1 is a block diagram of an example MRI system for use in accordance with aspects of the present disclosure.

Referring now to FIG. 1, the above-described systems and methods may be implemented using or designed to accompany a magnetic resonance imaging ("MRI") system 100, such as is illustrated in FIG. 1. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchange between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

Figure 2:
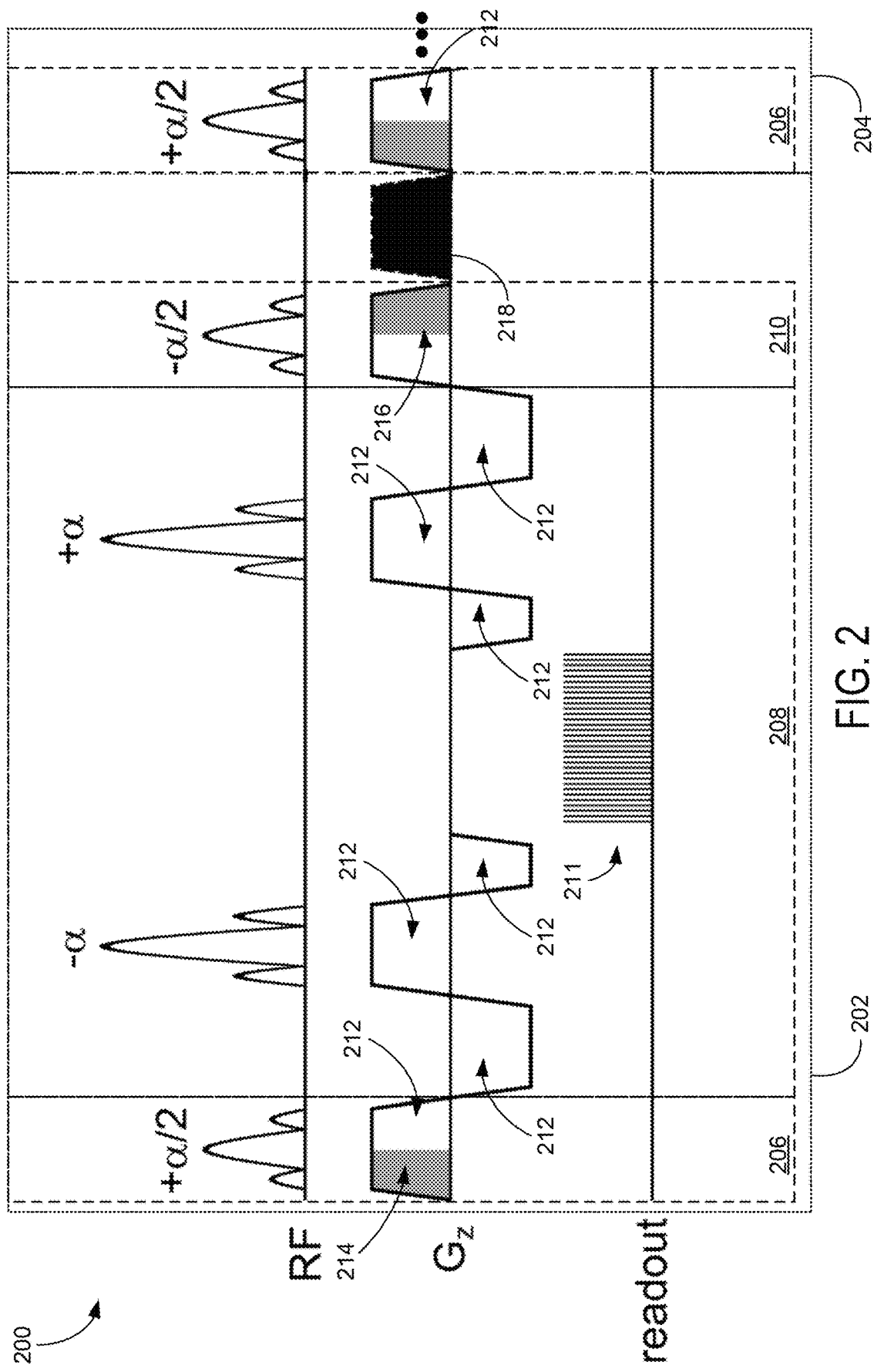
FIG. 2 is a pictorial representation of a pulse sequence performed by the MRI system of FIG. 1 in accordance with the present disclosure. Gradient activity in the phase-encoding and readout-encoding axes are not shown.

Referring now to FIG. 2, a pulse sequence 200 is provided that is one example of an implementation of the radial fast interrupted steady-state (FISS) pulse sequence or technique as provided in the present disclosure. The FISS technique may be used to suppress flow and off-resonance artifacts that are encountered with previously-described steady-state imaging techniques. As will be described, the pulse sequence 200 may generally be of the form of a gradient-echo pulse sequence. In the illustrated, non-limiting example, gradient activity in the phase-encoding and read-out-encoding axes are not shown, but would be readily understood by one of ordinary skill in the art as being generally consistent with a gradient-echo pulse sequence with negligible gradient area when summed. The pulse sequence 200 includes a series of FISS modules 202, 204 that are formed from an $\alpha/2$ pulse module 206, a (readout, $\alpha)_n$ module 208, an $\alpha/2$ pulse module 210 giving rise to a readout 211, where $\alpha$ denotes the excitation radiofrequency flip angle, n denotes the number of repetitions, and the phases of applied $\alpha$ and $\alpha/2$ RF pulses alternate. As illustrated, the phases of applied $\alpha$ and $\alpha/2$ RF pulses alternate.

In one non-limiting example, n is selected to allow control of flow artifacts. For example, n may be selected to range between 1 and 7 repetitions. In another non-limiting example, n is at least 1 and less than one-half the number of views that are acquired using the pulse sequence 200. The readout of the (readout, $\alpha)_n$ module 208 may use a radial sampling of k-space. In some aspects, data is collected using radial sampling of k-space with a trajectory in which radial views are distributed across an azimuthal angle of at least 540 degrees. In some aspects, an offset frequency is varied across the radial views.

In a manner analogous to bSSFP pulse sequence, the FISS pulse sequence of this example pulse sequence 200 uses balanced gradients 212. However, akin to spoiled gradient-echo imaging pulse sequence, the unbalanced gradient areas 214, 216 are applied in the slice-select direction ($G_z$) near the $\alpha/2$. An optional spoiler gradient 218 may be applied between FISS pulse modules 202, 204 to further spoil residual transverse magnetization. In addition, the pulse sequence 200 may include a magnetization preparation targeted to fat suppression or magnetization transfer that precedes the FISS modules 202, 204. In addition, the phases of the applied RF pulses may be varied between modules to further spoil residual transverse magnetization.

The use of $\alpha/2$ pulses in the respective modules 206, 210 interrupts (i.e. stops and starts) the bSSFP echo train ($\pm\alpha$) and stores the on-resonance spectral band along z as longitudinal magnetization using the $\pm\alpha/2$ pulse. Simultaneously, off-resonance spectral bands can be suppressed by balanced gradients 212. The balanced gradients 212 are the gradients that are not the spoiler gradients 218 or the spoiler gradient 218. In some aspects, the $\alpha/2$ pulses in the respective modules 206, 210 may be applied to interrupt the bSSFP echo train at a rate greater than, as a non-limiting example, 30 Hz. In other aspects, the rate ranges between 50 and 100 Hz. Interrupting the bSSFP echo train at these higher frequencies was found to significantly reduce flow artifacts when compared with conventional bSSFP techniques.

The pulse sequence 200 may include flow-sensitizing or velocity encoding gradients to acquire the MR data from the subject with flow- or phase-encoding. To form a flow-sensitive, phase contrast image, multiple datasets are acquired with differing flow-sensitizing gradients applied (e.g., one with and one without flow-sensitizing gradients) to create two different image sets that are subtracted to form MR angiograms of the subject that illustrate flow.

The FISS technique 200, which spoils residual traverse magnetization between one FISS module to the next, markedly reduces flow artifacts characteristic of conventional bSSFP imaging and offers advantages over previously described techniques. In some aspects, using a low number of repetitions, n (e.g. 1 to 7), provides benefits by suppressing steady-state magnetization from out-of-slice spins as well as strongly oscillating signals from off-resonant spins in the transient-state that begin to accumulate with a higher number of repetitions. Thus, the number of repetitions can be selected to control against the generation of undesirable flow artifacts.

In some aspects, using a radial k-space trajectory offers improvements over a Cartesian k-space trajectory. In some aspects, when multiple bSSFP readouts are collected (i.e. n>1), radial sampling is less sensitive than Cartesian sampling to artifacts caused by mild signal fluctuations arising from the interrupted nature of the FISS module. With Cartesian k-space sampling, these signal fluctuations produce ghost artifacts in the phase-encoding direction. Conversely, these small signal variations produce minimal to no apparent artifacts with radial sampling. By distributing the signal fluctuations over a large (>540 degrees) azimuthal range of radial views, FISS is highly effective at minimizing image artifacts due to the signal fluctuations. In other aspects, due to oversampling of central k-space, radial sampling is less sensitive than Cartesian sampling to motion and arterial pulsation artifacts.

Also, the above-described acquisitions may be paired with accelerated imaging techniques, such as radial under sampling, compressed sensing, or simultaneous multi-slice acquisitions, to further accelerate the data acquisition.

For example, phantom studies showed that the FISS technique described with respect to FIG. 2 retains the high SNR of bSSFP. Specifically, contrast achieved using the above-described FISS pulse sequence, when compared with images acquired using FLASH and bSSFP in a phantom containing eight dilutions of gadopentetate dimeglumine, clearly showed that FISS provides a contrast that is distinct from FLASH. Also, the FISS technique provides greater suppression of off-resonant spins with respect to bSSFP, as illustrated in FIGS. 3 A-D. As shown in FIGS. 3A-B, bSSFP demonstrates an approximate 5 fold increase in signal from out-of-slice magnetization near the off-resonant frequencies of $\pm 0.5/TR$ and $\pm 1.5/TR$ ($\pm 125$ Hz and $\pm 375$ Hz for TR=4 ms), FISS avoids this phenomenon and provides a more uniform signal spectrum. As used herein, TR may be defined as the spacing between $\alpha$ and $-\alpha$ RF pulses. Relevant to the imaging of flow in areas of off-resonance, the notches of suppressed off-resonance frequencies that are predicted for FISS imaging of stationary spins are eliminated for flowing spins. FISS also considerably reduces the median inter-readout complex signal differences (MISD) over the first 50 readouts as compared with bSSFP, as shown in FIGS. 3C-D. MO in FIGS. 3A-D denotes the equilibrium magnetization.

The FISS pulse sequence described with respect to FIG. 2 can also be combined with other imaging techniques. In one non-limiting example, the FISS technique can be used as a readout for pulse sequences performing time-of-flight studies or utilizing the "quiescent interval" (QI), such as the quiescent interval steady-state (QISS) and those described in co-pending patent application Ser. Nos. 12/574,856 and 13/026,482, which are incorporated herein by reference in its entirety, and the like. The FISS technique described above may be particularly useful as a readout for use with the QISS MRA technique at 3 Tesla. Studies of a QISS-FISS implementation showed greatly improved image quality compared with both bSSFP and FLASH readouts.

Figure 4:
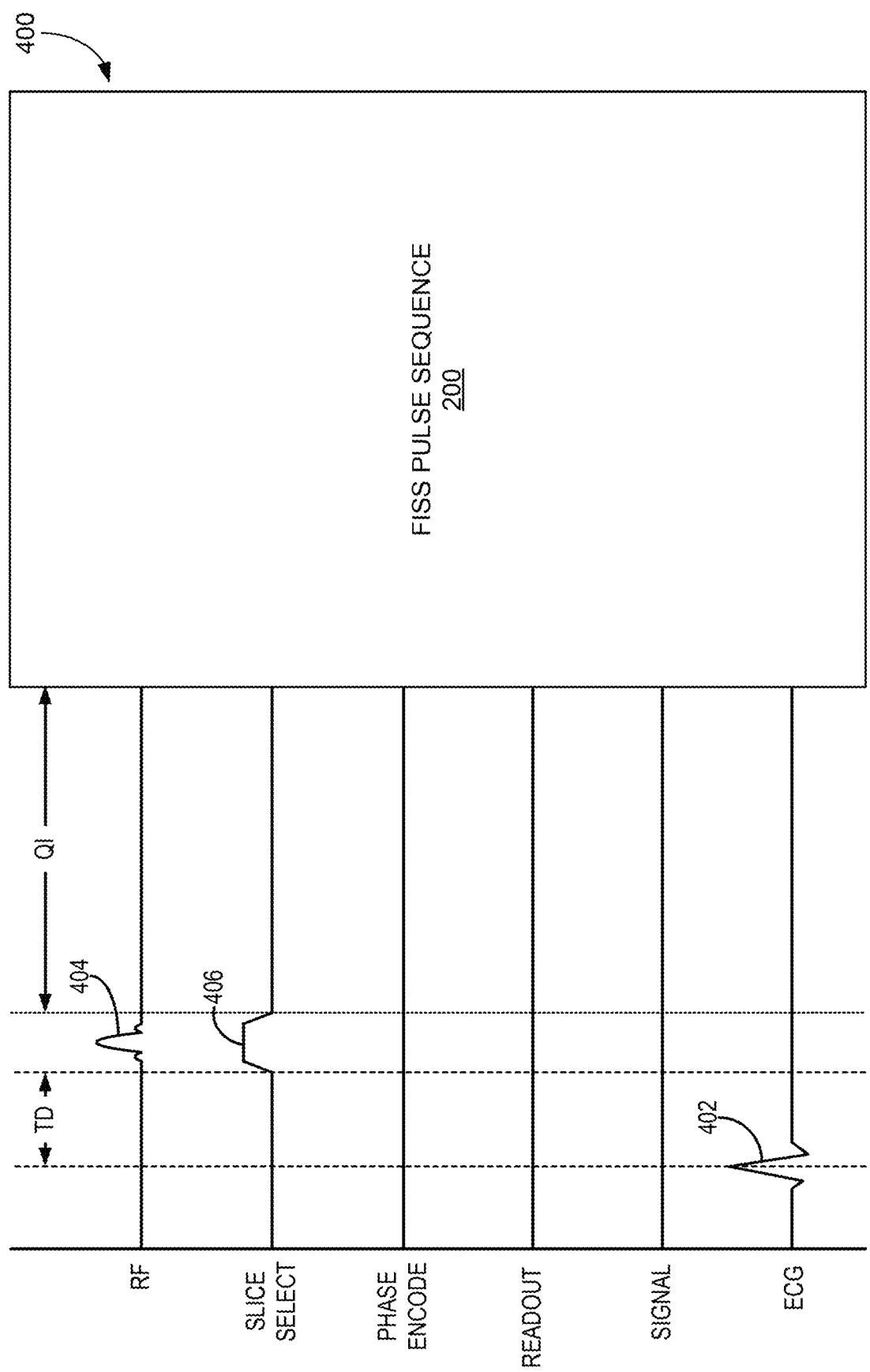
FIG. 4 is a pictorial representation of a QISS-FISS pulse sequence in accordance with the present disclosure.

Specifically, referring now particularly to FIG. 4, an example of a pulse sequence using a QI and, in particular, the QISS pulse sequence 400 is illustrated utilizing a FISS pulse sequence readout 200. The QISS pulse sequence 400 is cardiac gated, such that the acquisition of k-space data is timed with respect to the flow of arterial blood. Specifically, the pulse sequence 400 is timed to be played out with respect to the peak of the R-wave 402 in a concurrently acquired echocardiogram ("ECG"). It should be appreciated by those skilled in the art, however, that other methods for cardiac synchronization of the following pulse than relying on an ECG signal are possible. For example, cardiac synchronization can be achieved using self-gating techniques that rely on measurement of flow signal or phase. Once the trigger 402 is reached, a slice-selective RF saturation pulse 404 is first played out in the presence of a slice-selective gradient 406. The application of this slice-selective RF saturation pulse 404 has the effect of suppressing the signals from background tissues as well as those venous spins that are present in the prescribed slice. The flip angle for this slice-selective RF saturation pulse 404 may be about 90 degrees; however, larger or smaller flip angles may be desirable in some circumstances. The slice-selective RF saturation pulse 404 is timed to occur at a preset time delay (TD) after the occurrence of the R-wave 402. For example, TD may be set to 100 ms.

The duration of time that is allowed to pass after the application of the slice-selective RF saturation pulse 404 is herein referred to as the "quiescent interval" ("QI"). This duration of time is specifically tailored to coincide with the rapid inflow of arterial blood into a prescribed imaging slice, and so that the zero line of k-space is acquired during the slow, diastolic inflow of arterial blood into the imaging slice. More particularly, a central portion of k-space is sampled during the slow, diastolic inflow of arterial blood into the imaging slice before the peripheral regions of k-space are sampled. The result of this is a substantial suppression of flow-based image artifacts. Put another way, this provides a method that is substantially insensitive to flow velocities in the prescribed image slice. Moreover, the QI allows for a maximal inflow of unsaturated arterial spins into the imaging slice, such that an improved discrimination of arterial spins is provided in the resultant images. This is even so when the patient's vasculature is significantly impacted by vascular diseases such as peripheral vascular disease ("PVD"). Exemplary values of QI in this configuration of the pulse sequence are on the order of 260 ms.

After the QI has passed, the pulse sequence proceeds with data acquisition, which is accomplished, in this application, using the FISS pulse sequence described above with respect to FIG. 2.

Figure 5:
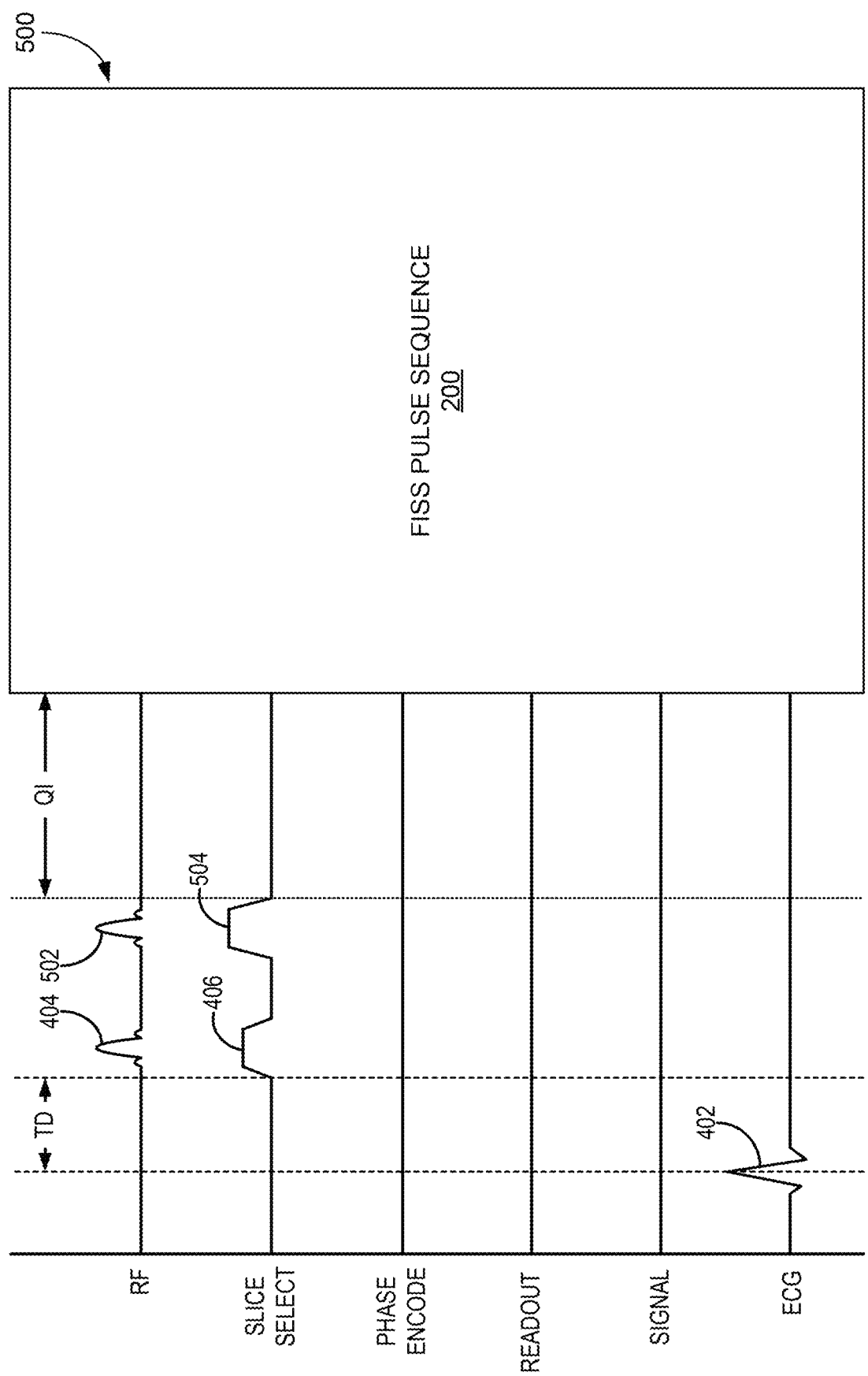
FIG. 5 is a pictorial representation of another QISS-FISS pulse sequence in accordance with the present disclosure.

Referring now to FIG. 5, another configuration of the QISS-FISS pulse sequence 500 is pictorially shown. This pulse sequence 500 is also cardiac gated, such that the acquisition of k-space data is timed with respect to the flow of arterial blood. Specifically, the pulse sequence is timed to be played out with respect to the peak of the R-wave 402 in a concurrently acquired echocardiogram ("ECG"). However, the data acquisition portion of the pulse sequence 500 is preceded by the application of multiple RF saturation pulses 404, 502. By employing RF saturation pulses 404, 502 instead of inversion recovery pulses, the longitudinal magnetization is always reset to zero prior to the beginning of the QI. This is not necessarily the case when employing inversion recovery-based methods, as residual longitudinal magnetization resulting from inadequate inversion may confound the subsequently detected MR signals. Moreover, by always resetting the longitudinal magnetization of the slice to zero, the use of a slice-selective RF saturation pulse ensures that the tissue signal remains substantially uniform across different slices despite variations in the R-R interval due to cardiac arrhythmias. This is not the case with inversion-recovery based methods.

First, a slice-selective RF saturation pulse 404 is played out in the presence of the slice-selective gradient 406. The application of this slice-selective RF saturation pulse 404 has the effect of suppressing the signals from background tissues as well as those venous spins that are present in the prescribed slice. The slice-selective RF saturation pulse 404 is timed to occur at the preset TD after the occurrence of the R-wave 402. For example, again, the TD may be set to 100 ms.

To suppress signals from venous spins that will flow into the prescribed slice, a second, slab-selective RF saturation pulse 502 is played out in the presence of a slab-selective gradient 504. The slab-selective RF saturation pulse 502 has the effect of suppressing venous signals in a slab that is contiguous with the prescribed imaging slice. Specifically, when imaging the peripheral arteries, the prescribed slab is chosen to be caudal to, and contiguous with, the prescribed imaging slice such that saturated venous blood flows into the imaging slice in the caudal-cranial direction while unsaturated arterial spins flow into the imaging slice in the cranial-caudal direction. Similarly, when imaging, for example, the carotid artery, the prescribed slab is chosen to be cranial to, and contiguous with, the prescribed imaging slice such that saturated venous blood flows into the imaging slice in the cranial-caudal direction while unsaturated arterial spins flow into the imaging slice in the caudal-cranial direction. Exemplary RF excitation slab thicknesses are on the order of 150 mm; however, it will be appreciated by those skilled in the art that other thicknesses can be selected depending on the intended application and subject at hand. It will also be appreciated that in some circumstances it may be desirable to shift the RF excitation slab so that it is not contiguous with the imaging slice.

In this alternate configuration of the pulse sequence, the QI is defined as the duration of time occurring after the application of the slab-selective RF saturation pulse 502 and before the FISS pulse sequence 200 is used to perform readout. Like the previously described QI, however, this duration of time is specifically tailored so that the zero line of k-space is acquired during the slow, diastolic inflow of arterial blood into the prescribed imaging slice. As described above, the result of allowing the QI to pass before data acquisition is a substantial suppression of flow-based image artifacts. Put another way, this provides a method that is substantially insensitive to flow velocities in the prescribed image slice. Exemplary values of QI in this configuration of the pulse sequence are on the order of 250 ms.

A comparison of axial QISS images through the heart using various readouts at 3 Tesla showed that QISS-bSSFP with flip angle of 30 degrees suffered from a signal hotspot with severe anatomic distortion at the medial margin of the heart, due to a combination of off-resonance and out-of-slice flow effects. However, at the same flip angle, QISS-FISS showed excellent flow contrast without significant artifacts. At a flip angle of 89 degrees, QISS-FLASH showed severe image degradation. At the same flip angle, QISS-FISS showed excellent image quality, without the issues present in the QISS-FLASH images.

It is to be appreciated by those skilled in the art, however, that other methods for gating and synchronization techniques may be used with the FISS pulse sequence 200. In one non-limiting example, respiratory gating and synchronization may be used in combination with the FISS pulse sequence 200. Additionally, motion reduction techniques such as navigator gating, and motion correction techniques to align a series of sequentially acquired images may be used in combination with the FISS pulse sequence 200. Gating and synchronization techniques may be used in combination with the FISS pulse sequence 200.

In another non-limiting example, the FISS technique can be combined with cine angiography techniques in order to enables the creation of cine angiograms usable to rapidly evaluate blood flow patterns and reliably quantify arterial flow velocities over the entire thickness and length of an artery. The FISS cine technique utilizes a novel semi-projective, highly-accelerated radial cine ASL technique. There are several advantages that arise from the using FISS with cine, including pronounced suppression of fat signal, elimination of through-plane flow artifacts; and reduction in banding artifacts caused by off-resonance effects. Additionally, imaging time is sufficiently short that the entire scan can be completed within a single breath-hold, allowing for robust evaluation of the vasculature in the chest or abdomen.

Figure 6:
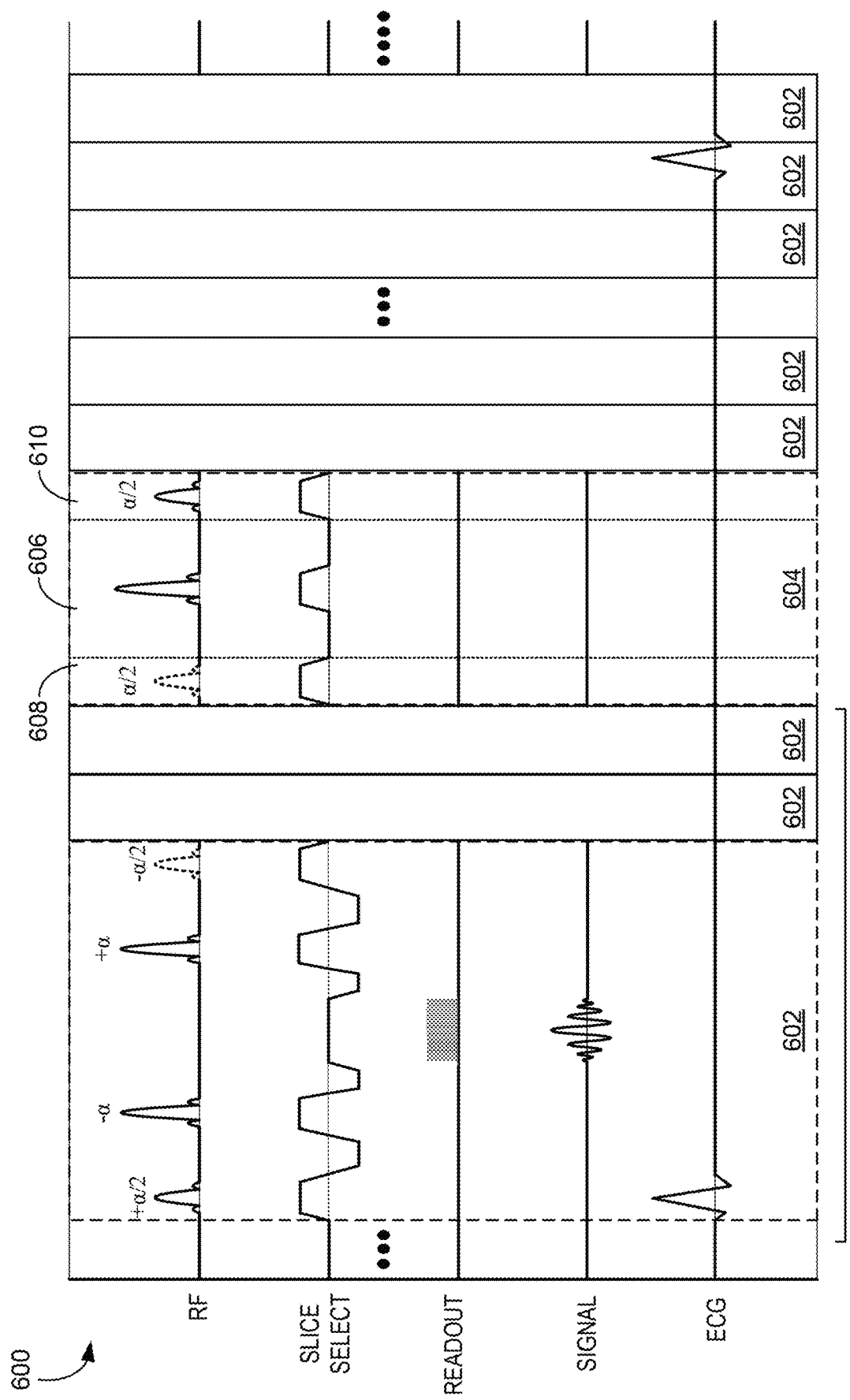
FIG. 6 is a pictorial representation of a FISS cine pulse sequence in accordance with the present disclosure.

Specifically, referring now to FIG. 6, a non-limiting example of a FISS cine pulse sequence 600 is illustrated. The FISS cine pulse sequence 600 includes an acquisition pulse sequence 601, and at least one labeling pulse sequence 604. Acquisition pulse sequence 601 can include a series of acquisition pulse modules 602 which may use 2D cine acquisition techniques or 3D cine acquisition techniques. Some 3D cine acquisition techniques can utilize a stack-of-stars k-space trajectory. In the illustrated example, acquisition pulse module 602 can use a FISS readout technique to collect MR data with a radial sampling of k-space with equidistant azimuthal sampling angles relative to adjacent radial samples of k-space. In other examples, the acquisition pulse module can use alternative readout techniques, such as a conventional bSSFP readout. The labeling pulse sequence 604 includes a labeling pulse module 606 and a pair $\alpha/2$ modules 608 and 610 bracketing labeling pulse module 606. In this case, a is equal to the excitation flip angle of the acquisition pulse 602. The $\alpha/2$ modules 608, 610 can be configured to have opposite polarities or they may be the same. The labeling pulse module 606 can be an inversion pulse module with a RF flip angle of 180 degrees, or it may have a RF flip angle which is less than 180 degrees.

In some examples, the $\alpha/2$ pulse modules 608, 610 of each labeling pulse sequence 604 can be shared with the adjacent acquisition pulse modules 602. In one example, the first $\alpha/2$ pulse module can be a $-\alpha/2$ pulse module from the end of the acquisition pulse module 602 that precedes the labeling pulse sequence 604, and the second $\alpha/2$ pulse module can be a $+\alpha/2$ pulse module from the start of the acquisition pulse module 602 that follows the labeling pulse sequence 604. In other examples, the polarity of the shared $\alpha/2$ pulse modules may vary and may be the same. In some examples, each labeling pulse sequence 604 can include separate $\alpha/2$ pulse modules 608, 610 which are not shared with the acquisition pulse sequences 602. It should further be appreciated that adjacent modules of the pulse sequence 602, 604, etc. may share an $\alpha/2$ pulse module 608, 610, such that the overall pulse sequence does not include two consecutive $\alpha/2$ pulses.

During the application of FISS cine pulse sequence 600, the cardiac cycle of the subject is continuously monitored as acquisition pulse sequence 601 is repeatedly applied at constant intervals to a vessel of interest of the subject. The MR data collected by the acquisition pulse modules 602 can, optionally, be later retrospectively gated by grouping the data into a series of temporally-resolved frames, with each frame representing a different phase of the cardiac cycle. Some 2D acquisition pulse modules 602 can use a slice thickness that is at least 20% larger than a cross-sectional dimension of the vessel of interest and hay have time-bandwidth product limited to a numerical value that is at least 1/12 of the thickness of the labeling slice as expressed in millimeters and not less than 1.0, thereby minimizing partial volume averaging and off-resonance effects that would otherwise degrade vessel conspicuity. Radial under-sampling techniques can further be employed by the acquisition pulse modules 602 in order to achieve a temporal resolution of each cine frame of at least 20 Hz. In other examples, other techniques, such as simultaneous multi-slice acquisition or the use of a compressed-sensing-based reconstruction in generating the cine frames, can be implemented in addition to, or in place of, the radial undersampling in order to improve temporal resolution.

The repeated application of acquisition pulse module 602 is briefly interrupted by regular labeling intervals lasting no more than approximately 30 ms, during which the labeling pulse sequence 604 is applied to label a region of inflowing arterial flow through the vessel of interest. The labeling pulse sequence 604 is applied to a labeling slice having a thickness of 50 mm or less, thereby labeling only a minority of the inflowing arterial spins such that the required wait time between applications of labeling pulse sequence 604 is significantly reduced. In some examples, the labeling pulse sequence 604 can be applied during alternate cardiac cycles and a slice-selection gradient for the labeling RF pulse module 606 can be turned off on alternative cardiac cycles to compensate for magnetization transfer effects. The labeling pulse sequence 604 may also be applied two or more times in each cardiac cycle. Further, the labeling pulse sequence 604 can be applied at any time during the cardiac cycles, and the timing of the each labeling pulse sequence 604 can vary with respect to the cardiac cycle. Following the completion of labeling pulse sequence 604, the application of the acquisition pulse modules 602 is resumed until the subsequent labeling interval.

As FISS cine pulse sequence 600 continues to apply the acquisition pulse module 602, with interruptions by the labeling pulse sequence 604, the cine frames generated from the collected MR data track the flow of labeled arterial spins through the artery of interest. In order to reduce or eliminate background signals in these cine frames without increasing scan time, a self-subtractive ASL technique can be utilized. Use of the self-subtractive ASL technique is facilitated by the retrospective gating of the MR data, which, in addition to allowing the collection of additional cine frames, maintains a steady background signal intensity. In the self-subtractive ASL technique, at least one cine image is used as a "mask" which is subtracted from all of the other cine images. In this way, the self-subtractive ASL method only requires a single scan, reducing scan time by a factor of two compared with the standard two-scan ASL approach. In some examples at least one motion correction technique, such as navigator gating, can be used to avoid subtraction artifacts due to patient motion.

Cine angiograms created in coordination with FISS cine pulse sequence 600 and the self-subtractive ASL technique represents arterial flow through the vessel of interest during the cardiac cycle with a temporal resolution sufficient to accurately quantify arterial flow velocities through an entire artery. The basic principle of flow velocity measurement using cine FISS ASL is fundamentally different from phase contrast. Whereas phase contrast measurements depend on flow-induced phase shifts, cine FISS ASL relies on the frame-to-frame bulk displacement of labeled spins, which translates in a straightforward way into in-plane flow velocity. Accurate in-plane flow velocity measurements are obtainable so long as temporal resolution and arterial conspicuity are sufficiently high.

Using the cine angiogram, the instantaneous flow velocity of the arterial flow is calculated as a ratio of a distance traveled by a leading edge of the arterial flow and the temporal resolution of the cine frames. Unlike arterial flow velocity measurement with phase contrast, flow velocity measurements with FISS cine ASL are relatively free from partial volume effects—a benefit of the extreme level of background signal suppression and resistance to off-resonance effects. Moreover, they are largely unaffected by gradient-induced eddy currents or Maxwell field effects that are sources of measurement error common with phase contrast measurement.

FISS cine with ASL can additionally be utilized to dynamically visualize blood flow along the entire length of both renal arteries including intra-renal branches with a single thick-slice breath-hold acquisition. This allows direct comparison of flow patterns and velocities in the left and right renal arteries, which might be useful for determining the hemodynamic significance of a renal artery stenosis. In addition to renal artery stenosis, the semi-projective ASL technique has potential clinical utility in a variety of other vascular disorders. For instance, using FISS cine ASL can be used to rapidly evaluate flow patterns in the pulmonary arteries to identify occluded branches in a patient with suspected pulmonary embolism.

EXAMPLES

The following example sets forth, in detail, ways in which the present disclosure may be used or implemented, and will enable one of skill in the art to more readily understand the principles thereof. The following example is presented by way of illustration and is not meant to be limiting in any way. The use of a FISS cine pulse sequence is more particularly described in the following example which is intended for illustration purposes only, since numerous modifications and variations will be apparent to those skilled in the art.

Methods

Eight healthy subjects (5 male, age 24 to 54 years) were imaged at 1.5 T. Following standard localizer scans, breath-hold cine images were acquired in the left ventricular (LV) 2-chamber, 3-chamber, and 4-chamber views, as well as obliquely through the aortic valve.

Cine FISS

One way that FISS differs from conventional bSSFP is that FISS disrupts the steady-state magnetization at frequent intervals. The steady-state magnetization undergoes gradient and radiofrequency (RF) spoiling after each block of bSSFP modules (5 to 8 in this study) to suppress off-resonant and out-of-slice spins. To avoid artifacts that would otherwise occur from these repeated disruptions, the technique uses a radial k-space trajectory with equidistant view angles.

To evaluate some of the relative benefits of this new technique in the heart, breath-hold cine FISS and Cartesian cine bSSFP were acquired using identical spatial resolution, numbers of shots and cine frames. Retrospective electrocardiographic (ECG)-gated cine imaging was performed with standard inline reconstruction of 32 cine frames. Scan parameters included: scan time=12 heart beats per slice, 96 radial views for cine FISS, ipat factor=2 for Cartesian cine bSSFP, acquisition matrix=144, field of view=340-mm, 12 shots, sampling bandwidth=1085 Hz/pixel, echo time~1.3 msec, sequence repetition time 2.6 msec, flip angle~70 degrees. Slice thickness was 6-mm. For imaging of the aortic valve, scans were repeated using 2-mm slices, and radial cine bSSFP was acquired in addition to Cartesian cine bSSFP and cine FISS. Image evaluation was performed by a radiologist with training in noninvasive cardiac imaging.

Quantitative Analysis

Biplane LV ejection fraction was calculated using the 2-chamber and 4-chamber long axis views. Epicardial and subcutaneous fat to right ventricular (RV) blood pool contrast-to-noise ratios (CNR) were calculated as: (signal[blood pool]−signal[fat])/(temporal standard deviation of signal in nearby hypointense lung tissue).

Qualitative Analysis

Cine image quality for the heart was graded using a 4-point scale (1=LV myocardium not visualized, severe artifact; 2=myocardium poorly visualized; moderate artifact; 3=myocardium moderately well visualized, mild artifact; 4=myocardium well visualized, negligible artifact.) Conspicuity of the aortic valve at peak systole was rated on a 4-point scale ranging from 1=aortic valve leaflets not visualized, severe artifact to 4=aortic valve leaflets well visualized, negligible artifact. Coronary artery conspicuity was rated on a four-point scale, ranging from 1=left anterior descending coronary artery (LAD) not visualized, severe artifact to 4=LAD well visualized, negligible artifact. Statistical analyses were done in SPSS. Continuous data was analyzed using paired t-tests or linear regression analysis, while ordinal data for two and three groups were compared using Wilcoxon signed-rank and Friedman tests, respectively.

Cine FISS ASL

For localization of the aorta and branch vessels prior to flow imaging, breath-hold images were acquired with a radial quiescent interval slice-selective (QISS) pulse sequence (2-mm thick slices, 1 or 2 shots). Cine ASL using a FISS readout was used to dynamically visualize in-plane blood flow in the descending thoracic aorta and to depict flow patterns in two widely-separated aortic branch vessels (coronary and renal arteries). Spin labeling was accomplished by applying a 16 to 25-mm thick adiabatic inversion RF pulse to inflowing arterial blood. Background suppression was obtained by complex sub-traction of the labeled and unlabeled cine image series, which were acquired on alternate RR intervals. Imaging parameters included 110 radial views, scan time of 16 heart beats per slice, 8 shots, and 32 reconstructed cine frames. Temporal resolution was z 20-44 msec depending on the heart rate and number of number of bSSFP modules per block. A slice thickness of 6-mm was typically used for flow quantification in the aorta and renal arteries. In addition, slice thicknesses up to 48-mm were tested for semi-projective imaging, with the goal of displaying the entire length and thickness of a target vessel in a single cine image series.

For the coronary arteries, the QISS image showing the longest length of the LAD coronary artery was used to center a five-slice (overlap=20%, one slice per breath-hold) cine FISS ASL acquisition using 3-mm thick slices.

Flow Phantom

A pulsatile flow circuit consisting of 6.35 mm diameter tubing filled with a 70% water/30% glycerin mixture (pumping frequency 60 Hz) was used to validate the cine FISS ASL measurement of flow velocity, as given by the ratio of: (mean distance traveled by the tagged bolus over one pump cycle)/(pump cycle duration).

In-Plane Flow Velocity Quantification

For the aorta, maximal flow velocity was quantified as the ratio of: (distance traveled by the leading edge of the tagged blood at peak systole)/(frame duration). Breath-hold 2D cine phase contrast with a through-plane velocity encoding of 150 cm/s was used as the reference standard. Given the small caliber of the coronary arteries, maximum intensity projections of several thin overlapping cine FISS ASL slices for each diastolic frame were analyzed to ensure that the labeled bolus could be tracked over a sufficient vessel length.

Results

The RR intervals during the CMR examinations ranged from approximately 685 msec to 1225 msec. There was no significant difference between Cartesian cine bSSFP and cine FISS in the calculated biplane LV ejection fraction (67.5%±4.3% vs. 68.3%±3.6%, p=NS) nor in qualitative image ratings for the heart (4.0±0.0 vs. 4.0±0.0, p=NS). Cine FISS showed much greater suppression of epicardial fat signal in all subjects, as well as reduced signal from subcutaneous fat (RV-to-epicardial fat blood pool CNR=40.6±11.4 (mean±standard deviation) for cine FISS vs 12.7±10.5 for cine bSSFP, p=0.002; RV-to-subcutaneous fat blood pool CNR=42.5±10.8 for cine FISS vs 0.7±8.4 for cine bSSFP, p<0.001). Banding artifacts in the subcutaneous tissues were consistently less apparent with cine FISS compared with cine bSSFP.

Compared with cine bSSFP, cine FISS significantly improved visualization of the coronary arteries (coronary artery conspicuity=4.0±0.0 for cine FISS vs. 2.6±0.5 for cine bSSFP, p=0.019).

For imaging of the aortic valve using a 6-mm slice thickness, image quality was not significantly different for cine FISS, Cartesian and radial cine bSSFP (4.0±0.0 vs. 3.5±0.5 vs. vs. 3.6±0.5, respectively, p=NS). Conspicuity of the aortic valve leaflets was maximized by imaging with 2-mm thick slices using cine FISS, whereas thin-slice imaging resulted in increased artifacts using either Cartesian or radial cine bSSFP. Aortic valve conspicuity values were 4.0±0.0 for cine FISS versus 2.3±0.5 for radial cine bSSFP and 2.4±0.7 for Cartesian cine bSSFP (p=0.001).

Dynamic flow patterns were well shown in the aorta, coronary and renal arteries using cine FISS ASL. The labeled bolus could be reliably visualized in subtracted images over the entire cardiac cycle as it traversed the length of the vessel. In contrast, the bolus could only be reliably visualized over a few cine frames in non-subtracted images.

Flow velocity measurements in the pulsatile flow phantom showed excellent correlation (r2=0.997, p=0.001) between cine FISS ASL and 2D cine phase contrast.

In healthy subjects, there was excellent correlation between maximal aortic flow velocities measured by cine FISS ASL and 2D phase contrast (r2=0.959, p<0.001). Mean coronary flow velocity, measured with cine FISS ASL over a z 209±97 msec (mean±sd) span of diastole was 11.7±3.0 cm/s. The cine FISS ASL contrast-to-noise ratio between the coronary artery and background was 16.5±6.1.

DISCUSSION OF RESULTS

With cine FISS, coronary artery conspicuity is greatly improved throughout the cardiac cycle because the suppression of fat signal negates chemical shift artifact at the boundary between the vessel wall and surrounding epicardial fat. The ability to rapidly image the coronary arteries throughout the cardiac cycle might add diagnostic value to conventional static navigator-gated 3D coronary CMR angiography in certain cases. For instance, it might be used to dynamically asses the severity of kinking at the origin of a potentially malignant coronary anomaly, or to demonstrate phasic narrowing of a coronary bridge.

For cross-sectional imaging of the aortic valve, we found that bSSFP flow artifacts were negligible for 6-mm thick slices but became significant when the slice thickness was reduced to 2-mm, resulting in decreased conspicuity of the valve leaflets. In contrast, the aortic valve leaflets were sharply delineated using thin-slice cine FISS. While such thin slices are not routinely used for cardiac imaging, they might be helpful in situations where high spatial resolution is needed, e.g. for precise multi-phase CMR measurements of the aortic valve apparatus in patients who are scheduled for transcatheter aortic valve replacement (TAVR).

In the current study, high radial undersampling factors were used to achieve cine frame rates as high as 50 Hz in a single breath-hold acquisition. In-plane cine FISS ASL flow velocity measurements correlated well with through-plane phase contrast measurements in a pulsatile flow phantom and the aorta. Moreover, the use of a thick slice (up to 48-mm in our study) with cine FISS ASL allowed semi-projective imaging of blood flow, which is not possible with 2D cine phase contrast techniques due to partial volume averaging of flow-induced phase shifts in the artery with background phase shifts in static tissues.

Initial empirical experience with semi-projective imaging suggests that using an excitation RF pulse with a large time-bandwidth product is key to preserving arterial detail in thick-slice acquisitions, presumably because doing so maximizes the slice-select gradient and helps to overcome intra-voxel dephasing from local field inhomogeneities. Alternatively, one can create a maximum intensity projection from several overlapping thin-slice cine ASL acquisitions.

The present invention has been described in terms of one or more preferred embodiments, and it should be appreciated that many equivalents, alternatives, variations, and modifications, aside from those expressly stated, are possible and within the scope of the invention.

What is claimed is:

1. A method for controlling a magnetic resonance imaging (MRI) system to create magnetic resonance (MR) cine angiograms of a subject, the method comprising:
   (a) monitoring a cardiac cycle of the subject;
   (b) controlling the MRI system to acquire MR data from the subject by performing at least one cine acquisition pulse sequence by:
      (i) applying a plurality of acquisition radiofrequency (RF) pulse modules at constant intervals throughout the cardiac cycle between a labeling interval to acquire the MR data using a radial sampling of k-space;
      (ii) during the labeling interval, labeling a region of inflowing arterial flow through a vessel of interest in the subject by performing at least one labeling pulse sequence including a first α/2 RF pulse module, a labeling RF pulse module, and a second α/2 RF pulse module, wherein α denotes a RF flip angle of the acquisition RF pulse module;
   (c) reconstructing the MR data to form a series of cine frames that form an MR cine angiogram of the subject;
   (d) subtracting at least one cine frame reconstructed from the MR data from other cine frames reconstructed from the MR data; and
   (e) displaying the MR cine angiogram of the vessel of interest.

2. The method of claim 1, wherein the cine acquisition pulse sequence is a 2D cine acquisition pulse sequence which samples k-space using a slice thickness that is at least 20% larger than a cross-sectional dimension of the vessel of interest.

3. The method of claim 2, wherein the acquisition RF pulse module has a time-bandwidth product having a numerical value that is at least 1/12 of the thickness of the imaging slice as expressed in millimeters and not less than 1.0.

4. The method of claim 1, wherein the cine acquisition pulse sequence samples k-space with a temporal resolution of each cine frame of at least 20 Hz.

5. The method of claim 1, wherein labeling the region of inflowing arterial flow includes labeling a labeling slice having a thickness of 50 mm or less.

6. The method of claim 1, wherein the cine angiogram represents arterial flow through the vessel of interest during the cardiac cycle.

7. The method of claim 6, wherein displaying includes illustrating an instantaneous flow velocity of the arterial flow, wherein the instantaneous flow velocity is a ratio of a distance traveled by a leading edge of the arterial flow and the temporal resolution of the cine frames.

8. The method of claim 1, wherein the radial sampling of k-space uses equidistant azimuthal sampling angles relative to adjacent radial samples of k-space.

9. The method of claim 1, wherein the labeling pulse sequence is applied during alternate cardiac cycles.

10. The method of claim 1, wherein a slice-selection gradient for the labeling RF pulse module is turned off on alternative cardiac cycles to compensate for magnetization transfer effects.

11. The method of claim 1, wherein acquiring the MR data includes performing at least one of a radial undersampling or simultaneous multi-slice acquisition or the reconstructing includes performing a compressed-sensing-based reconstruction.

12. The method of claim 1, wherein the labeling pulse sequence is performed at least twice in each cardiac cycle.

13. The method of claim 1, wherein the cine acquisition pulse sequence is a 3D cine acquisition pulse sequence which uses a stack-of-stars k-space trajectory.

14. The method of claim 1, wherein at least one motion correction technique is used to avoid subtraction artifacts due to patient motion.

15. The method of claim 14, wherein navigator gating is one of the at least one motion correction techniques.

16. The method of claim 1, wherein the labeling RF pulse module is an inversion RF pulse module having a RF flip angle of 180 degrees.

17. The method of claim 1, wherein the second $\alpha/2$ RF pulse module has a polarity that is opposite the first $\alpha/2$ RF pulse module.

18. The method of claim 1, wherein the acquisition RF pulse module is a fast interrupted steady-state (FISS RF) pulse module.

19. The method of claim 18, wherein the first $\alpha/2$ RF pulse module and the second $\alpha/2$ RF pulse module of the labeling pulse sequence are shared with adjacent FISS RF pulse modules.

20. The method of claim 1, further comprising grouping the MR data using the monitoring of the cardiac cycle of the subject to retrospectively gate MR data based on a phase of the cardiac cycle during which MR data was acquired.

21. A magnetic resonance imaging (MRI) system comprising:
    a magnet system configured to generate a polarizing magnetic field about at least a portion of a subject including a vessel of interest arranged in the MRI system;
    a plurality of gradient coils configured to apply a gradient field to the polarizing magnetic field;
    a radio frequency (RF) system configured to apply an excitation field to the subject and acquire MR image data from the subject;
    a computer system programmed to generate a plurality of differently-weighted images of a subject by:
    (a) performing at least one cine acquisition pulse sequence by:
        (i) applying a plurality of acquisition radiofrequency (RF) pulse modules at constant intervals throughout the cardiac cycle between a labeling interval to acquire the MR data using a radial sampling of k-space;
        (ii) during the labeling interval, labeling a region of inflowing arterial flow through a vessel of interest in the subject by performing at least one labeling pulse sequence including a first $\alpha/2$ RF pulse module, a labeling RF pulse module, and a second $\alpha/2$ RF pulse module, wherein a denotes a RF flip angle of the acquisition RF pulse module, and the second $\alpha/2$ RF pulse module;
    (b) reconstructing the MR data to form a series of cine frames that form an MR cine angiogram of the subject;
    (c) subtracting at least one cine frame reconstructed from the MR data from other cine frames reconstructed from the MR data; and
    a display coupled to the computer system to display the MR cine angiogram of the vessel of interest.

22. The system of claim 21, wherein the cine acquisition pulse sequence is a 2D cine acquisition pulse sequence which samples k-space using a slice thickness that is at least 20% larger than a cross-sectional dimension of the vessel of interest.

23. The system of claim 21, wherein the cine acquisition pulse sequence samples k-space with a temporal resolution of each cine frame of at least 20 Hz.

24. The system of claim 23, wherein the acquisition RF pulse module has a time-bandwidth product having a numerical value that is at least 1/12 of the thickness of the labeling slice as expressed in millimeters and not less than 1.0.

25. The system of claim 21, wherein labeling the region of inflowing arterial flow includes labeling a labeling slice having a thickness of 50 mm or less.

26. The system of claim 21, wherein cine angiogram represents arterial flow through the vessel of interest during the cardiac cycle.

27. The system of claim 26, wherein displaying includes illustrating an instantaneous flow velocity of the arterial flow, wherein the instantaneous flow velocity is a product of a distance traveled by a leading edge of the arterial flow and the temporal resolution of the cine frames.

28. The system of claim 21, wherein the radial sampling of k-space uses equidistant azimuthal sampling angles relative to adjacent radial samples of k-space.

29. The system of claim 21, wherein the labeling pulse sequence is applied during alternate cardiac cycles.

30. The system of claim 21, wherein a slice-selection gradient for the labeling RF pulse module is turned off on alternative cardiac cycles to compensate for magnetization transfer effects.

31. The system of claim 21, wherein acquiring the MR data includes performing at least one of a radial undersampling or simultaneous multi-slice acquisition or the reconstructing includes performing a compressed-sensing-based reconstruction.

32. The system of claim 21, wherein the labeling pulse sequence is performed at least twice in each cardiac cycle.

33. The system of claim 21, wherein the cine acquisition pulse sequence is a 3D cine acquisition which uses a stack-of-stars k-space trajectory.

34. The system of claim 21, wherein at least one motion correction techniques is used to avoid subtraction artifacts due to patient motion.

35. The system of claim 34, wherein navigator gating is one of the at least one motion correction techniques.

36. The system of claim 21, wherein the labeling RF pulse module is an inversion RF pulse module having a RF flip angle of 180 degrees.

37. The system of claim 21, wherein the acquisition RF pulse module is a FISS RF pulse module.

38. The system of claim 37, wherein the first $\alpha/2$ RF pulse module and the second $\alpha/2$ RF pulse module of the labeling pulse sequence are shared with adjacent FISS RF pulse modules.

39. The system of claim 21, further comprising grouping the MR data using the monitoring of the cardiac cycle of the subject to retrospectively gate MR data based on a phase of the cardiac cycle during which MR data was acquired.

* * * * *

UNITED STATES PATENT AND TRADEMARK OFFICE
CERTIFICATE OF CORRECTION

PATENT NO. : 10,859,658 B2
APPLICATION NO. : 16/395835
DATED : December 8, 2020
INVENTOR(S) : Robert R. Edelman et al.

It is certified that error appears in the above-identified patent and that said Letters Patent is hereby corrected as shown below:

In the Specification

Column 5, Line 29, "case, a denotes" should be --case, α denotes--.

Column 6, Lines 1-8 are duplicate descriptions of FIGS. 3B-3D and should be deleted.

Column 8, Line 64, "where a denotes" should be --where α denotes--.

Column 13, Line 21, "case, a is" should be --case, α is--.

Column 16, Line 32, "z 20-44" should be --≈ 20-44--.

Column 17, Line 37, "a z 209±97" should be --a ≈ 209±97--.

In the Claims

Column 18, Line 40, Claim 1, "wherein a denotes" should be --wherein α denotes--.

Column 20, Line 6, Claim 21, "wherein a denotes" should be --wherein α denotes--.

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*